United States Patent
Pilz

(10) Patent No.: US 9,261,539 B2
(45) Date of Patent: Feb. 16, 2016

(54) METHOD FOR MEASURING AN ELECTRICAL CURRENT AND APPARATUS FOR THIS PURPOSE

(75) Inventor: Karl Pilz, Graz (AT)

(73) Assignee: MAGNA STEYR Fahrzeugtechnik AG & Co KG, Graz (AT)

( * ) Notice: Subject to any disclaimer, the term of this patent is extended or adjusted under 35 U.S.C. 154(b) by 367 days.

(21) Appl. No.: 13/635,739

(22) PCT Filed: Mar. 18, 2011

(86) PCT No.: PCT/EP2011/054151
§ 371 (c)(1),
(2), (4) Date: Nov. 19, 2012

(87) PCT Pub. No.: WO2011/113939
PCT Pub. Date: Sep. 22, 2011

(65) Prior Publication Data
US 2013/0169297 A1 Jul. 4, 2013

(30) Foreign Application Priority Data

Mar. 18, 2010 (DE) .......................... 10 2010 012 869
Mar. 19, 2010 (DE) .......................... 10 2010 012 101

(51) Int. Cl.
*G01R 27/08* (2006.01)
*G01R 19/00* (2006.01)
(Continued)

(52) U.S. Cl.
CPC ............ *G01R 19/00* (2013.01); *G01R 19/0092* (2013.01); *G01R 27/02* (2013.01); *G01R 27/08* (2013.01); *G01R 27/14* (2013.01); *G01R 27/16* (2013.01); *G01R 27/26* (2013.01)

(58) Field of Classification Search
CPC ............... G01R 19/00; G01R 19/0084; G01R 19/0092; G01R 27/02; G01R 27/08; G01R 27/14; G01R 27/16; G01R 27/26
USPC .......... 324/713, 691, 649, 600, 522, 512, 500
See application file for complete search history.

(56) References Cited

U.S. PATENT DOCUMENTS 5,959,464 A * 9/1999 Qualich .................... 324/750.06
5,977,751 A * 11/1999 Blessing et al. .............. 320/134
(Continued)

FOREIGN PATENT DOCUMENTS

CN    85106483 A    3/1987
CN     1107975 A    9/1995
(Continued)

OTHER PUBLICATIONS

Jinghuan Jia, Chinese Patent Application No. 201180014173.3 Second Office Action, Dec. 1, 2014, 1 page, State Intellectual Property Office of the People's Republic of China, Beijing, China. English abstract submitted.

(Continued)

*Primary Examiner* — Hoai-An D Nguyen
(74) *Attorney, Agent, or Firm* — Jordan IP Law, LLC; Todd A. Vaughn

(57) ABSTRACT

A method for measuring an electrical current with the aid of a field effect transistor inserted into a current path is disclosed, in which a control voltage is applied between the gate and source of the transistor in such a way that the voltage drop between the drain and source at the transistor in the current path remains within a specifiable range. Further, said voltage drop and the control voltage are determined. With these two values, and with a known relationship between the drain-source current, the drain-source voltage and the gate-source voltage the value of the current of interest can now be determined. Apparatus for implementing the method according to the invention is, furthermore, disclosed.

15 Claims, 4 Drawing Sheets

(51) Int. Cl.
*G01R 27/02* (2006.01)
*G01R 27/14* (2006.01)
*G01R 27/26* (2006.01)
*G01R 27/16* (2006.01)

(56) References Cited

U.S. PATENT DOCUMENTS

| | | | |
|---|---|---|---|
| 7,589,490 B2* | 9/2009 | Haesters et al. | 318/811 |
| 9,076,805 B2* | 7/2015 | Thiele | H01L 23/58 |
| 2005/0094333 A1* | 5/2005 | Astala | H02J 7/0029 |
| | | | 361/35 |
| 2008/0191779 A1* | 8/2008 | Heppenstall | 327/427 |
| 2009/0140749 A1* | 6/2009 | Spah | 324/600 |
| 2009/0267589 A1* | 10/2009 | Zhang et al. | 324/123 R |

FOREIGN PATENT DOCUMENTS

| | | |
|---|---|---|
| CN | 101029910 A | 9/2007 |
| CN | 101029916 A | 9/2007 |
| CN | 201159747 Y | 12/2008 |
| WO | 98/10301 A | 3/1998 |

OTHER PUBLICATIONS

Jinghuan Jia, Chinese Patent Application No. 201180014173.3 Search Report, Nov. 20, 2014, 2 pages, State Intellectual Property Office of the People's Republic of China, Beijing, China. English abstract submitted.

* cited by examiner

METHOD FOR MEASURING AN ELECTRICAL CURRENT AND APPARATUS FOR THIS PURPOSE

RELATED APPLICATIONS

The invention is based on DE 10 2010 011 869.9, filed on Mar. 18, 2010 in Germany, and on DE 10 2010 012 101.0, filed on Mar. 19, 2010 in Germany, and is a national phase of the international application PCT/EP2011/054151, filed on Mar. 18, 2011, which are all hereby incorporated by reference.

TECHNICAL FIELD

The invention relates to a method for measuring an electrical current with the aid of a field effect transistor inserted into a current path, in which a voltage drop between the drain and source at the transistor in the current path is measured, and the value of the current of interest is determined on the basis of said voltage drop and of a known relationship between the drain-source current and the drain-source voltage. The invention furthermore relates to apparatus for measuring an electrical current, comprising a transistor for insertion into a current path, means for determining a voltage drop between the drain and source of the transistor in the current path, and means for determining the value of the current of interest on the basis of said voltage drop and of a known relationship between the drain-source current and the drain-source voltage.

PRIOR ART

Usually electrical current is measured by means of the voltage drop across an ohmic measuring resistor or "shunt". These shunts consist of a special alloy, and have a constant resistance value. The voltage drop measured across the shunt is then directly proportional to the current flow (I=U/R). For some time now, field effect transistors (FETs) have also been used for current measurement in place of ohmic resistors. The shunt is here replaced by the controllable channel resistance $R_{ds}$ of a field effect transistor.

The channel resistance of a MOSFET, $R_{ds}$, depends on the temperature of the transistor (or, more precisely, of the transistor's substrate), on the gate voltage $U_{gs}$ and on the drain-source voltage $U_{ds}$. FIG. 1 shows an example of this in what is in itself a known context. On a graph in which the drain-source current $I_{ds}$ is plotted against the drain-source voltage $U_{ds}$, characteristic curves for various gate-source voltages $U_{gs1} \ldots U_{gs5}$ are shown. It is well-known that the channel resistance $R_{ds}$ is determined from $U_{ds}/I_{ds}$. The dotted line in FIG. 1 furthermore separates the linear region $B_L$ from the saturation region $B_S$ of the FET transistor. FIG. 2 moreover illustrates the dependency of the channel resistance $R_{ds}$ on the temperature T. A number of solutions are known from the prior art for measuring current with the aid of a field effect transistor.

WO 1998/010301 A1, for instance, discloses a current measuring circuit in which a load is supplied with electrical energy through a transistor. The voltage drop across the transistor resulting from the current, and the temperature of the transistor, are measured. The effective channel resistance is determined with the aid of the measured temperature, and the channel resistance and the measured voltage drop are then used to determine the value of the current of interest.

DE 10 2004 039 392 B3 furthermore discloses a method for determining the current in an electrical device, which is controlled by a field effect transistor coupled to the device according to the pulse-width modulation method. According to that method, the voltage across the source-drain region of the field effect transistor is measured, as is a temperature in the neighborhood of the field effect transistor. The present value of the current is determined from the measured values, together with the pulse width, and with the aid of temperature compensation.

U.S. Pat. No. 6,867,576 B2 also discloses that a field effect transistor with a smaller capacitance can be connected in parallel with a power field effect transistor, allowing the voltage drop across the power field effect transistor to be used to determine the current through it. The result of this measurement is employed in order to switch the power field effect transistor off if the measured voltage exceeds a particular threshold value.

Finally, U.S. Pat. No. 7,154,291 B2 discloses a method for measuring a current through a field effect transistor in which the drain-source voltage is measured for this purpose. The temperature of the field effect transistor is also measured, so that its channel resistance can be determined accurately. From the same voltage and the channel resistance it is then easy to determine the value of the current of interest flowing through the transistor.

FIG. 3 then shows an arrangement, in itself known, of a field effect transistor, FET, that is located on a common substrate S with temperature measuring diodes D. The field effect transistor FET comprises connections for the gate g, drain d and source s. In this way, the temperature of the temperature measuring diodes D is to a large extent the temperature T of the transistor, whereby it is possible largely to avoid errors of measurement. FIG. 4 furthermore illustrates the relationship between the voltage $U_T$ dropped across the temperature measuring diodes D and the temperature T.

A disadvantage of the known methods is that it is only possible to measure currents with a relatively small range of values. The known circuits are thus unsuitable for larger ranges of measurement, or must be extended using complicated circuits to expand the range of measurement.

DISCLOSURE OF THE INVENTION

The purpose of the invention therefore is to disclose an improved method or improved apparatus for measuring electrical currents, in particular for relatively large ranges of measurement.

The problem underlying the invention is solved by means of a method for measuring an electrical current with the aid of a field effect transistor inserted into a current path, comprising the steps of:

applying a control voltage between the gate and source of the transistor in such a way that the voltage drop between the drain and source at the transistor in the current path remains within a specifiable range, determining said voltage drop, determining the control voltage, determining the value of the current of interest on the basis of said voltage drop, the control voltage, and a known relationship between the drain-source current, the drain-source voltage and the gate-source voltage.

Determination of the control voltage here is a very simple procedure, which commonly, for instance, does not require a measurement, since the control voltage in the method described is predetermined.

Furthermore, the problem underlying the invention is solved with apparatus for measuring an electrical current, comprising a transistor for insertion into a current path, a control unit, which is provided for applying a control voltage between the gate and the source of the transistor in such a way that the voltage drop between the drain and the source at the transistor in the current path remains within a specifiable range, means for determining said voltage drop and the control voltage, means for determining the value of the current of interest on the basis of said voltage drop, the control voltage and of a known relationship between the drain-source current, the drain-source voltage and the gate-source voltage.

The invention overcomes the restriction, present in the prior art, that the field effect transistor may only be operated in switched mode or in the saturation region, since in the known solutions merely the dependency of the channel resistance on the temperature is taken into account. According to the invention, the channel resistance $R_{ds}$ is now controlled in such a way that the voltage drop $U_{ds}$ remains small, and the measured object is thus not influenced. This makes it possible to measure both large currents (with a small $R_{ds}$) as well as very small currents (with a large $R_{ds}$). The transistor temperature T depends to a large extent on the power dissipation resulting from the flow of current, and little influence can therefore be had on it. A suitable channel resistance $R_{ds}$ is thus set by means of the gate-source voltage $U_{gs}$. For this purpose the gate voltage $U_{gs}$ is controlled in such a way that the drain-source voltage $U_{ds}$ lies within defined limits (e.g. 10 mV-90 mV). The influence on the object being measured is thus kept small, and the power dissipation is manageable. The speed with which changes in the current can be registered thus depends only on the computation speed of the hardware in use and the sampling frequency of the ADCs (analogue/digital converters) and DACs (digital/analogue converters). One of the ways in which the high dynamic range of the measuring principle described is achieved is that the field effect transistor is neither being used as a switch (variable gate voltage $U_{gs}$) nor only in the linear region.

The specifiable range for the voltage drop $U_{ds}$ between the drain and the source can, for instance, lie between 10 mV and 90 mV. Nevertheless, depending on, amongst other things, the component employed and the desired application, other ranges may also be more appropriate.

Favorable embodiments and further developments of the invention emerge from the dependent claims and from the description in combination with the figures in the drawing.

Favorably, the control voltage $U_{gs}$ between the gate and the source of the transistor is held constant for as long as the voltage drop $U_{ds}$ between the drain and the source remains within the specifiable range, and the control voltage $U_{gs}$ is increased or decreased by a discrete amount if the voltage drop $U_{ds}$ between the drain and the source leaves the specifiable range. As a result, when the voltage drop $U_{ds}$ between the drain and source leaves the specifiable range, it is once again firmly returned into that range. In order to determine the value of the current of interest, a whole array of characteristic curves (relationships between the drain-source current and the drain-source voltage at different gate-source voltages) is used. It is also possible to use characteristic curves in the region of the transition between the restricted region and the linear region of the field effect transistor, i.e. at very small gate-source voltages $U_{gs}$. The result is a particularly high measuring range for determining the value of the current of interest.

It is advantageous if the relationship between the drain-source current, the drain-source voltage and the gate-source voltage is determined in an initialization step. Rather than relying on the information provided by the manufacturer in data sheets, in this variant of the invention the relationship between the drain-source current, the drain-source voltage and the gate-source voltage of a specific transistor is determined. Scatter in the parameters due to manufacturing tolerances of the transistor can be avoided in this way. If the determination of said relationship is repeated at a later time, it is also possible to avoid inaccuracies of measurement resulting from aging of the components.

It is furthermore advantageous if the relationship between the drain-source current, the drain-source voltage and the gate-source voltage is present as a channel resistance in the form of a polynomial $$R_{ds}=k_0+k_1 \cdot U_{ds}+k_2 \cdot U_{ds}^2+\ldots+k_n \cdot U_{ds}^n$$

whereby different sets of coefficients $k_0 \ldots k_n$ are provided for different control voltages. A polynomial is particularly suited for this approximation due to the non-linearity of the channel resistance. In order to allow for the effect of the control voltage, different sets of coefficients are stored for the various control voltages. Linear or non-linear interpolation can be done for the region between the individual polynomials. The value of the current of interest can then easily be calculated using the formula $$I_M = \frac{U_{ds}}{R_{ds}}$$

A method in which the temperature of the transistor is also determined, the known relationship between the drain-source current, the drain-source voltage and the gate-source voltage also comprises the dependency on the transistor temperature, and the transistor temperature is taken into account when determining the value of the current of interest is particularly advantageous.

Because the power dissipation arising in the field effect transistor can, in some circumstances, result in significant heating, it is advantageous to take its temperature into account when determining the current measurement, since the temperature does have a significant effect on the channel resistance of the transistor. In the region of small gate-source voltages in particular, the characteristic curves describing the relationship between the drain-source current and the drain-source voltage show a strong dependency on temperature, and therefore taking into account the transistor temperature is of particular importance in this region. A very high or very low ambient temperature that has an effect on the field effect transistor can also, of course, considerably distort the measurement result if it is not taken into account.

It is advantageous in this connection if different sets of coefficients are provided for different transistor temperatures. If the relationship between the drain-source current, drain-source voltage and the gate-source voltage is stored as a channel resistance in the form of a polynomial, different sets of coefficients can simply be provided for different transistor temperatures, in order to account for the effect of the temperature. Taking the transistor temperature into account is thus particularly easy.

It is convenient if the voltage drop between the drain and source of the transistor remains to a large extent constant, and independent of the current that is to be measured. In this way the "measuring range" of the transistor, and thus the power dissipation arising in the transistor, can be adjusted particularly precisely.

In a further advantageous variant of the invention, at least one temperature measuring diode is provided as a temperature sensor. Temperature measuring diodes are proven, reliable components for the measurement of temperature. The apparatus according to the invention can thus be put into practice with little technical complexity, and is moreover less liable to failure. Other components for temperature measurement, thermistors for example, can, of course, also be employed.

In this connection it is particularly favorable if the minimum of one temperature measuring diode is operated in combination with a constant current source or with a constant voltage source together with a series resistor, and the voltage drop across the minimum of one temperature measuring diode is taken as a gage for the transistor temperature. Since the voltage at the temperature measuring diodes changes proportionally to the temperature, a temperature measurement in this case can be done particularly easily.

It is, furthermore, particularly advantageous if the means for determining the transistor temperature comprises a temperature sensor that is located on the same substrate as the transistor. In this way an error in the measurement of the transistor temperature can be to a large extent avoided, since the temperature sensor (e.g. the temperature measuring diodes) has very much the same temperature as the transistor.

In a further advantageous variant of the invention, a plurality of transistors are connected in parallel. By connecting a plurality of transistors in parallel the current measuring range can be extended easily should the measuring range of the apparatus according to the invention be insufficient, even though it is already large. The properties of the transistors that are connected in parallel may be the same, or may be different. The temperature measurement, moreover, can be carried out individually at each transistor. It is also conceivable that a temperature measurement is carried out at only one transistor, if the transistors are, for instance, mounted on a common heat sink and if a small loss in precision can be accepted. It is also possible for the temperature measuring diodes associated with the individual FETs (of the same type) to be connected in series, so determining a mean temperature.

It is also, however, advantageous for a plurality of transistors to be connected in antiparallel. Both positive and negative currents can be measured with transistors connected in antiparallel. The apparatus according to the invention can thus be operated in a bidirectional manner.

At this stage it is to be pointed out that the variants, and the advantages that result from them, described for the method according to the invention apply equally to the apparatus according to the invention, and vice versa.

It is also pointed out that the apparatus according to the invention can be reproduced in software, in hardware, or in a combination of these. If the controller is implemented in software, then the steps required for the method and the parameters can be stored, for instance in a memory, and can be loaded into a processor and processed there at run-time.

The embodiments and further developments of the invention described above can be combined in any desired manner.

BRIEF DESCRIPTION OF THE FIGURES

The present invention is explained in more detail below on the basis of the exemplary embodiments in the schematic figures of the drawing. They show.

DETAILED DESCRIPTION OF THE INVENTION

Figure 5:
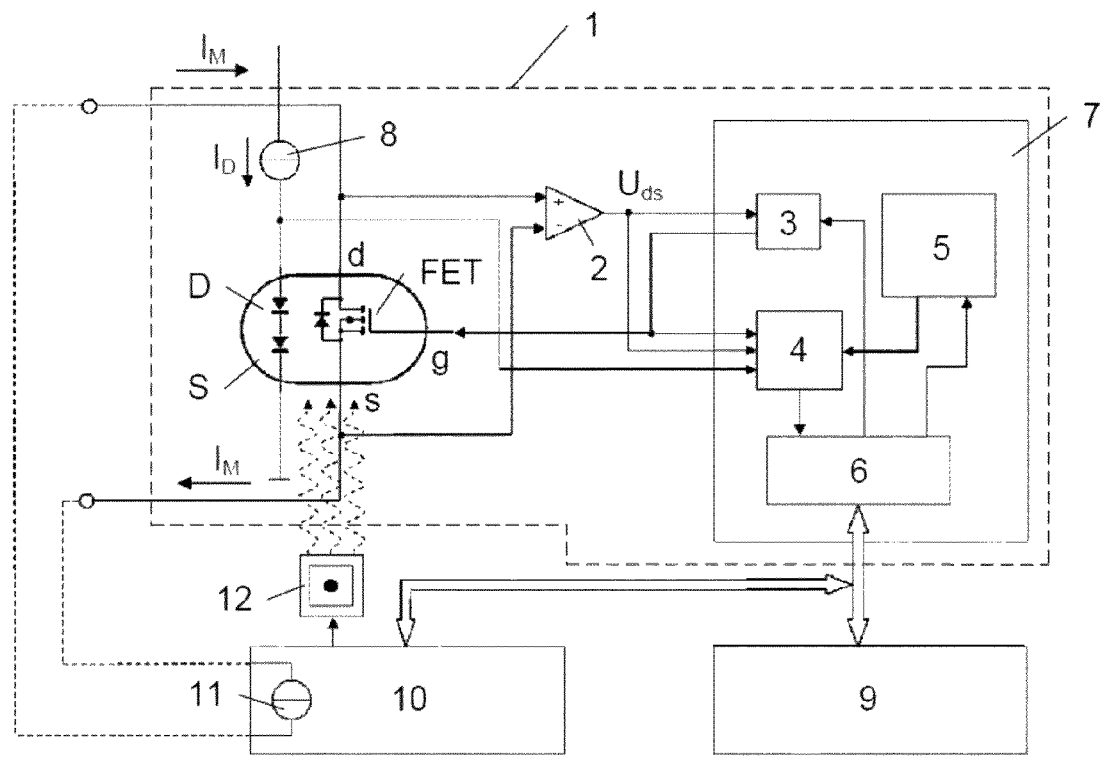
FIG. 5 Apparatus according to the invention for measuring an electrical current and FIG. 6 An example of how the relationship between the measurement current and the drain-source voltage can be determined.

FIG. 5 shows a variant of apparatus 1 according to the invention for measuring a current $I_M$. The apparatus 1 comprises a transistor FET that is connected by its drain d and source s in a current path. A differential amplifier 2 measures the drain-source voltage $U_{ds}$ and supplies it to a control unit 3. The drain-source voltage $U_{ds}$ is also fed to an input of a measurement acquisition unit 4. An output of the control unit 3 is connected to the gate g of the transistor FET and to an input of the measurement acquisition unit 4. Finally, the measurement acquisition unit 4 is connected to a memory 5, in which the relationship between the drain-source current $I_{ds}$, the drain-source voltage $U_{ds}$ and the gate-source voltage $U_{gs}$ is stored, for instance in the form of a function for the drain-source current $I_{ds}$ as a function of the drain-source voltage $U_{ds}$ and of the gate-source voltage $U_{gs}$. The apparatus 1 also comprises a data interface 6 for communication of the control unit 3, the measurement acquisition unit 4 and the memory 5 with external devices.

The control unit 3, the measurement acquisition unit 4, the memory 5 and the data interface 6 are, in the example illustrated, housed in a measuring module 7. This grouping may indeed be advantageous, but is quite arbitrary. The equipment required for the invention can, of course, be grouped in other ways. The differential amplifier 2, for instance, could also be part of the measuring module 7. It is, moreover, to be pointed out that the partition of the function according to the invention into a differential amplifier, control unit 3, measurement acquisition unit 4 and memory 5 is also entirely arbitrary. The functions could equally well be executed by other functional units. Finally it is to be explained that the functions required to implement the invention can be represented in hardware and/or software. It is, for instance, conceivable that the functionality is executed primarily by a program running in a processor. It is also, however, conceivable, that the function is embodied in an ASIC (application specific integrated circuit).

The basic function of the apparatus according to the invention is thus as follows:

With the aid of the control unit 3, a control voltage $U_{gs}$ is imposed between the gate g and the source s of the transistor FET, in such a way that the voltage drop $U_{ds}$ between the drain d and the source s at the transistor FET in the path of the current remains within a specifiable range. In a variant of the invention, the control voltage $U_{gs}$ is selected in such a way that the voltage drop $U_{ds}$ remains altogether largely constant, and independent of the current to be measured. With the aid of the measurement acquisition unit 4, the concrete values for the control voltage $U_{gs}$ and of said voltage drop $U_{ds}$ are now determined. In this way the value of the current of interest $I_M$ is determined with the aid of the relationship between the drain-source current $I_{ds}$, the drain-source voltage $U_{ds}$ and the gate-source voltage $U_{gs}$ that are stored in the memory 5. With a known transistor characteristic curve, known drain-source voltage $U_{ds}$ and known gate-source voltage $U_{gs}$, the drain-source current $I_{ds}$ can be determined, and this corresponds at the same time to the value of the current $I_M$ that is to be measured.

Said relationship between the drain-source current $I_{ds}$, the drain-source voltage $U_{ds}$ and the gate-source voltage $U_{gs}$ may be known from data sheets, or, better, are determined during an initialization step. In the last case, errors of measurement that result from manufacturing tolerances in the transistor FET can be largely avoided.

In one favorable variant of the invention, the relationship between the drain-source current $I_{ds}$, the drain-source voltage $U_{ds}$ and the gate-source voltage $U_{gs}$ is stored as a channel resistance $R_{ds}$ in the form of a polynomial $$R_{ds} = k_0 + k_1 \cdot U_{ds} + k_2 \cdot U_{ds}^2 + \ldots + k_n \cdot U_{ds}^n$$

whereby different sets of coefficients $k_0 \ldots k_n$ are provided for different control voltages $U_{gs}$.

Since the characteristic curves of the transistor FET also vary strongly with its temperature, in a further favorable variant of the invention, the temperature T of the transistor FET is additionally determined, and is taken into account in determining the value of the current $I_M$ of interest. For this purpose the known relationship between the drain-source current $I_{ds}$, the drain-source voltage $U_{ds}$ and the gate-source voltage $U_{gs}$ is extended in such a way that the dependency on the transistor temperature T is also incorporated. If said relationship is stored in the form of the polynomial explained above, then for different transistor temperatures T (and for different gate-source voltages $U_{gs}$) different sets of coefficients $k_0 \ldots k_n$ are made available.

Figure 3:
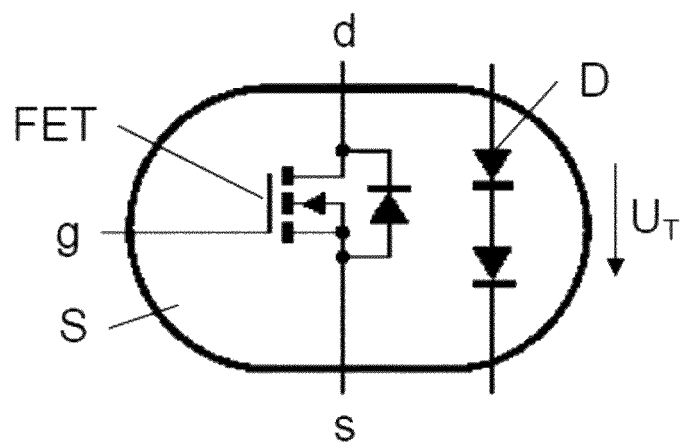
FIG. 3 An arrangement in which a field effect transistor and temperature measuring diodes are arranged on one common substrate.
Figure 4:
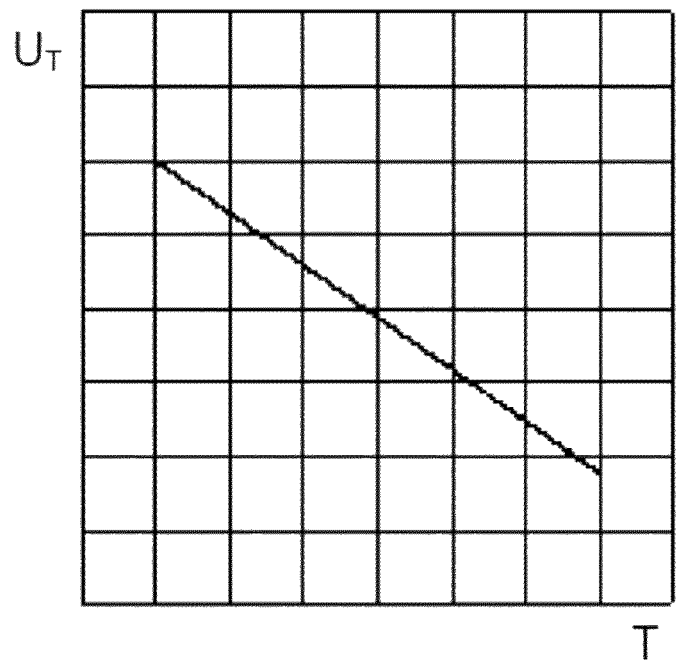
FIG. 4 The dependency of the voltage drop across the temperature measuring diodes on the temperature.

In order to determine the transistor temperature T, the apparatus also comprises two temperature measuring diodes D, located on the same substrate S as the transistor FET, in order to obtain the most accurate measurement result possible. The temperature measuring diodes D are connected to a constant current source 8, so that a voltage $U_T$ that depends on the temperature of the diodes D, and therefore on the transistor temperature T, is dropped across the temperature measuring diodes D (see also FIGS. 3 and 4 in this connection). This voltage $U_T$ is measured by the measurement acquisition unit 4, and is taken into account in the determination of the drain-source current $I_{ds}$, for instance in that the different sets of coefficients $k_0 \ldots k_n$ for the polynomial of the channel resistance $R_{ds}$ explained above are made available. Other temperature-dependent elements are of course suitable for measuring the transistor temperature T (e.g. thermistors), in particular those that can be mounted on the same substrate S as the transistor FET. A constant voltage source with a series resistor can also be provided in place of the constant current source 8. At this point it is also to be noted that the number of temperature measuring diodes D used is to be considered purely exemplary. Other variants of the circuit according to the invention comprise, for instance, only one temperature measuring diode D.

The control of the gate voltage $U_{gs}$ by the control unit 3 is advantageously separate from the measurement of that voltage by the measurement acquisition unit 4. In this way it is possible on the one hand to construct a control loop, while on the other hand the gate voltage $U_{gs}$ that is actually present is determined. It is also, however, possible simply to control the gate voltage $U_{gs}$ and to directly use its setpoint value to determine the value of the current of interest $I_M$. This variant of the circuit yields results that are not quite so precise, but is easier to construct.

FIG. 5 finally shows an external device connected to the apparatus 1 according to the invention, namely a personal computer (PC) 9 for data display and for further processing of the measured values, a calibration unit 10 with an integrated constant current source 11, and a heater 12 connected to the calibration unit 10. Alternatively, or in addition, a cooling unit may also be provided, for instance if the operating temperatures are low or the currents to be calibrated are high.

In the course of the calibration process, a matrix of coefficients $k_0 \ldots k_n$ for the channel resistance $R_{ds}$ is determined, and is recorded in the non-volatile memory 5 of the measuring module 7. The calibration unit 10 here controls the heater 12 in such a way that the apparatus 1, which is favorably located in a climate-controlled chamber, can be brought to a specific temperature. If the measuring module 7 is now to be calibrated, it is (temporarily) connected to the calibration unit 10, and is switched into calibration mode by a special command transmitted through the interface 6. In calibration mode, a defined range of operating temperatures (e.g. 0° C. to 80° C.) is worked through in a number of stages (e.g. 32 stages). The individual increments may be constant (e.g. 2.5° C. each), or may vary. After a specific temperature T, which is measured by the temperature measuring diodes D, has been reached, a starting value for the control or gate voltage $U_{gs}$ is applied. If the temperature T and the gate voltage $U_{gs}$ are constant, then a calibration current from the constant current source 11 is adjusted in such a way that a specified voltage drop $U_{ds}$ (e.g. 40 mV) develops at the transistor FET.

Figure 1:
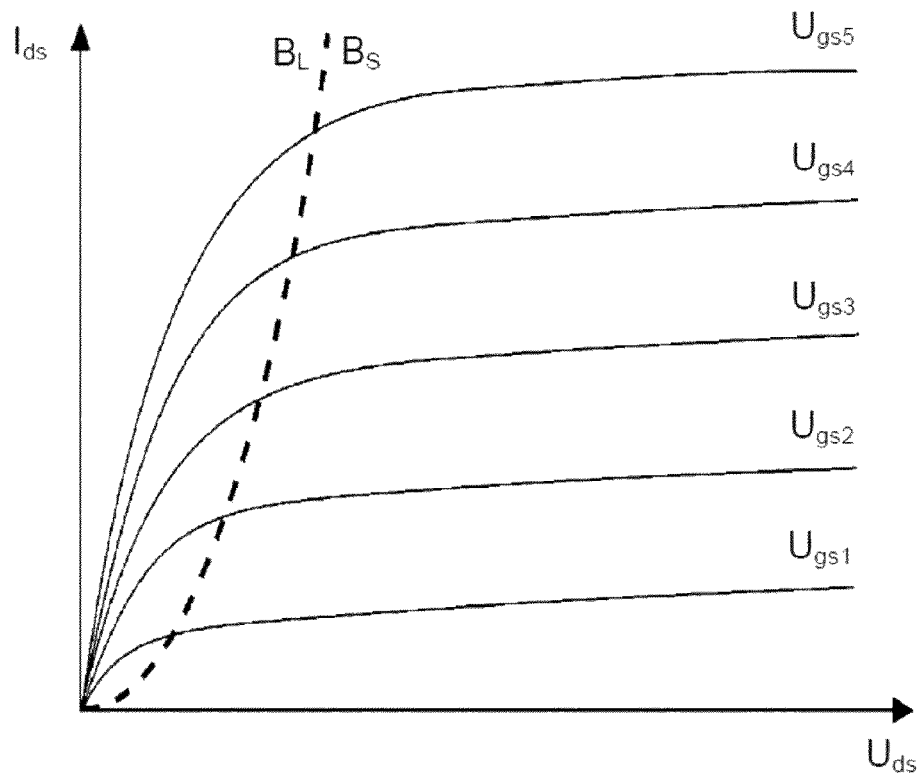
FIG. 1 Output characteristics of a field effect transistor.
Figure 2:
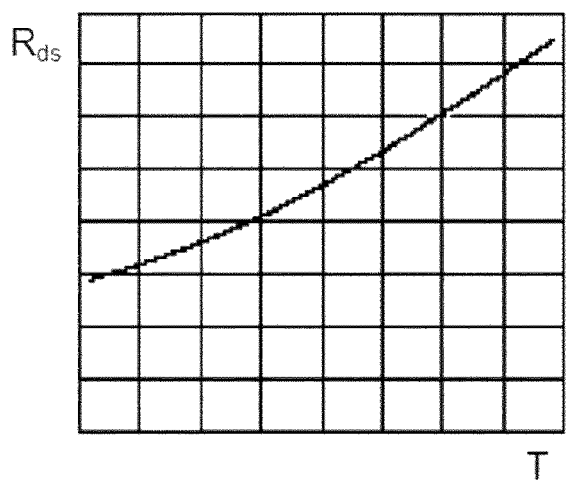
FIG. 2 The dependency of the channel resistance of a field effect transistor on the temperature.

As explained above, and as can be seen in FIG. 1, the channel resistance $R_{ds}$ is only approximately linear over a small range. For precise measurements it is therefore necessary to describe the channel resistance through a polynomial of a relatively high order.

Figure 6:
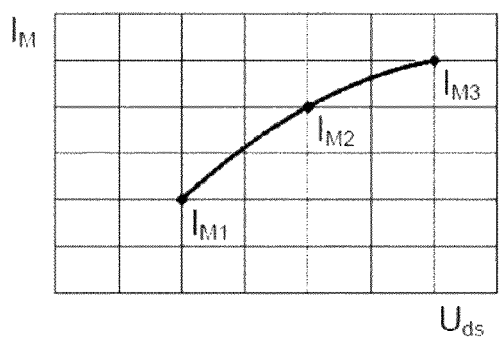

For that reason, as shown in FIG. 6, a plurality of values for $U_{ds}$ (e.g. 20, 40 and 60 mV) are specified, and the associated test currents ($I_{M1}$, $I_{M2}$, $I_{M3}$, etc.) are determined. In further steps, the polynomial coefficients $k_0 \ldots k_n$, which describe the dynamic channel resistance $R_{ds}$ at a particular gate voltage $U_{gs}$ and temperature T of the substrate or transistor, are calculated, and are written through the data interface 6 into the $R_{ds}$ coefficient matrix of the measuring module 7.

$$R_{ds} = k_0 + k_1 \cdot U_{ds} + k_2 \cdot U_{ds}^2 + \ldots + k_n \cdot U_{ds}^n$$

This procedure is carried out for various gate voltages $U_{gs}$ (e.g. 50 increments). As in the case of the temperature increments, the individual increments here may be either constant or variable. After the coefficients $k_0 \ldots k_n$ for all the gate voltage values $U_{gs}$ have been found for one pass, the next higher temperature is set with the aid of the heater 12, and the calibration process is continued.

After working through all the temperature levels and the gate voltage values $U_{gs}$ the calibration process is complete, and the measuring module 7 is ready for use. It is, of course, possible to repeat the calibration at any stage in order, for instance, to avoid inaccurate measurements resulting from aging effects.

Although in principle it is possible to determine any number of sets of coefficients $k_0 \ldots k_n$, in other words arrays of characteristic curves, it is the nature of the case that when determining a drain-source current $I_M$ it is often also necessary to process intermediate values for the voltage $U_T$ and the gate voltage $U_{gs}$. In that case the polynomial coefficients $k_0 \ldots k_n$ for $R_{ds}$ can be determined from adjacent polynomials. The interpolation process may be linear or non-linear.

Figure 7A:
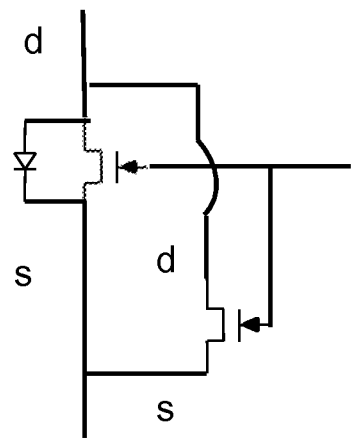
FIG. 7A illustrates a portion of an embodiment of the apparatus shown in FIG. 5 having two transistors in parallel with one another.
Figure 7B:
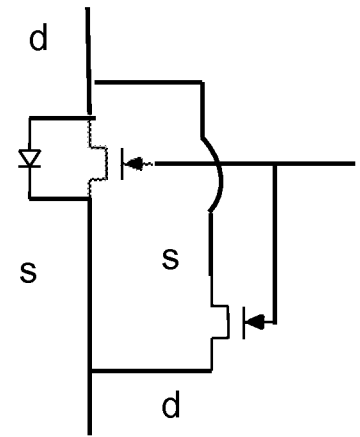
FIG. 7B illustrates a portion of an embodiment of the apparatus shown in FIG. 5 having two transistors in antiparallel with one another.

By connecting a plurality of transistors FET with different properties in parallel (FIG. 7A) it is, furthermore, possible to extend the range of measurable current. Both positive and negative currents can, moreover, be measured with transistors FET connected in antiparallel (FIG. 7B). The properties of the transistors FET that are connected in parallel may be different, or may be the same. When transistors FET of the same type are used, it is advantageous and sufficient to use a common control unit.

The method of measurement has been described with an enhancement mode n-channel MOSFET. It is, however, also possible to use other field effect transistors, such as depletion mode FETs, p-channel MOSFETs and so on.

Finally it is to be pointed out that the illustrations in the figures are only schematic, and that both additional elements or fewer elements may in fact be present. It is also possible for the individual variants shown in the figures to be the objects of an independent invention.

What is claimed is:

1. A method for measuring an electric current via a field effect transistor provided in a current path, the method comprising:
    applying a control voltage between a gate and a source of the field effect transistor in such a way that a voltage drop between a drain and the source of the field effect transistor remains within a predetermined range;
    determining the temperature of the field effect transistor;
    determining the voltage drop;
    determining the control voltage;
    determining a value of the electric current based on the determined voltage drop, the determined control voltage, and the relationship between the drain-source current, the drain-source voltage and the gate-source voltage; and
    providing a relationship between a drain-source current, a drain-source voltage and a gate-source voltage of a field effect transistor as a channel resistance $R_{ds}$ in a form of a polynomial having coefficients $k_0 \ldots k_n$, wherein a set of coefficients $k_0 \ldots k_n$ is provided with respect to each of a plurality of control voltages, wherein the polynomial has the form:

$$R_{ds}=k_0+k_1 \cdot U_{ds}+k_2 \cdot U_{ds}^2+ \ldots +k_n \cdot U_{ds}^n.$$

2. The method of claim 1, further including holding constant the control voltage between the gate and the source of the field effect transistor while the voltage drop between the drain and the source remains within the predetermined range.

3. The method of claim 2, further including varying the control voltage by a discrete amount if the voltage drop between the drain and the source is not within the predetermined range.

4. The method of claim 1, wherein the predetermined range of the voltage drop between the drain and the source is between 10 mV and 90 mV.

5. The method of claim 1, further including providing different sets of coefficients $k_0 \ldots k_n$ for different temperatures of the field effect transistor.

6. The method of claim 1, wherein the relationship between the drain-source current, the drain-source voltage and the gate-source voltage is at least partly based on the temperature of the field effect transistor.

7. The method of claim 6, wherein determining the value of the electric current takes into account the temperature of the field effect transistor.

8. A method for measuring an electric current via a field effect transistor provided in a current path, the method comprising:
    determining a relationship between a drain-source current, a drain-source voltage and a gate-source voltage of the transistor;
    applying a voltage between the gate and the source such that a voltage drop between the drain and the source remains within a predetermined range;
    determining the temperature of the field effect transistor;
    determining the voltage drop;
    determining the control voltage;
    determining the value of the electric current on the basis of the voltage drop, the control voltage, and the determined relationship between the drain-source current, the drain-source voltage and the gate-source voltage; and
    providing a relationship between a drain-source current, a drain-source voltage and a gate-source voltage of a field effect transistor as a channel resistance $R_{ds}$ in a form of a polynomial having coefficients $k_0 \ldots k_n$, wherein a set of coefficients $k_0 \ldots k_n$ is provided with respect to each of a plurality of control voltages, wherein the polynomial has the form:

$$R_{ds}=k_0+k_1 \cdot U_{ds}+k_2 \cdot U_{ds}^2+ \ldots +k_n \cdot U_{ds}^n.$$

9. The method of claim 8, wherein the predetermined range of the voltage drop between the drain and the source is between 10 mV and 90 mV.

10. The method of claim 9, further including holding constant the control voltage between the gate and the source of the while the voltage drop between the drain and the source remains within the predetermined range.

11. The method of claim 10, further including varying the control voltage if the voltage drop between the drain and the source is not within the predetermined range.

12. The method of claim 8, wherein:
    the relationship between the drain-source current, the drain-source voltage and the gate-source voltage is at least partly based on the temperature of the field effect transistor; and
    determining the value of the electric current takes into account the temperature of the transistor.

13. An apparatus for measuring electric current, comprising:
    a transistor provided in a path of the electric current;
    a control unit configured to apply a control voltage between the gate and the source of the transistor such that a voltage drop between the drain and the source remains within a predetermined range;
    means for determining the temperature of the transistor, wherein a relationship governing the determined value of the electric current comprises the temperature of the transistor, and the temperature of the transistor is taken into account when determining the value of the electric current;
    means for determining the voltage drop and the control voltage;
    means for determining a value of the electric current based on the determined voltage drop, the determined control voltage and a relationship between the drain-source current, the drain-source voltage and the gate-source voltage; and
    means for providing a relationship between a drain-source current, a drain-source voltage and a gate-source voltage of a field effect transistor as a channel resistance $R_{ds}$ in a form of a polynomial having coefficients $k_0 \ldots k_n$, wherein a set of coefficients $k_0 \ldots k_n$ is provided with respect to each of a plurality of control voltages, wherein the polynomial has the form:

$$R_{ds} = k_0 + k_1 \cdot U_{ds} + k_2 \cdot U_{ds}^2 + \ldots + k_n \cdot U_{ds}n.$$

14. The apparatus of claim 13, further comprising a plurality of transistors connected in parallel.

15. The apparatus of claim 13, further comprising a plurality of transistors connected in anti-parallel.

\* \* \* \* \*